United States Patent
Miyamoto et al.

(10) Patent No.: US 9,142,802 B2
(45) Date of Patent: Sep. 22, 2015

(54) DISPLAY DEVICE

(71) Applicant: Japan Display Inc., Tokyo (JP)

(72) Inventors: Mitsuhide Miyamoto, Tokyo (JP); Naoki Tokuda, Tokyo (JP); Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/495,953

(22) Filed: Sep. 25, 2014

(65) Prior Publication Data

US 2015/0084026 A1      Mar. 26, 2015

(30) Foreign Application Priority Data

Sep. 26, 2013   (JP) .................................. 2013-199975

(51) Int. Cl.
  *H01L 21/00*    (2006.01)
  *H01L 51/00*    (2006.01)
  *H01L 51/52*    (2006.01)
  *H01L 27/32*    (2006.01)

(52) U.S. Cl.
  CPC .......... *H01L 51/5275* (2013.01); *H01L 27/322* (2013.01); *H01L 27/3241* (2013.01)

(58) Field of Classification Search
  CPC . H01L 51/50; H01L 51/525; H01L 2227/326; H01L 27/32; H05B 33/14; H05B 33/0803; H05B 33/0896
  See application file for complete search history.

(56) References Cited

U.S. PATENT DOCUMENTS

2005/0275342 A1* 12/2005 Yanagawa ..................... 313/504

FOREIGN PATENT DOCUMENTS

| JP | 2000-322000 A | 11/2000 |
| JP | 2004-39500 A | 2/2004 |

\* cited by examiner

*Primary Examiner* — Hoai V Pham
(74) *Attorney, Agent, or Firm* — Lowe Hauptman & Ham, LLP

(57) ABSTRACT

Provided is a display device that even in the case where microlenses are formed to increase the light extraction efficiency, can decrease damage on an OLED caused by the production of the microlenses. The display device includes a first substrate; light emitting elements provided on the first substrate and located in correspondence with pixels arrayed in a matrix; a second substrate; a light collection layer provided on the second substrate and including, on the side facing the light emitting elements, at least one convex lens in correspondence with each of the pixels; and a light-transmissive layer that is provided between the first substrate and the second substrate so as to be in contact with the lens and has a refractive index lower than that of the light collection layer.

6 Claims, 15 Drawing Sheets

DISPLAY DEVICE

CROSS REFERENCE TO RELATED APPLICATIONS

This application is based upon and claims the benefit of priority from the prior Japanese Patent Application No. 2013-199975, filed on Sep. 26, 2013, the entire contents of which are incorporated herein by reference.

FIELD

The present invention relates to a display device using a light emitting element.

BACKGROUND

Display devices including light emitting elements using OLEDs (Organic Light-Emitting Diodes) are now being developed. Such a display device includes two glass substrates or the like attached to each other and light emitting elements located between the glass substrates. Therefore, light from the light emitting elements is output to an external space from one of the glass substrates. The light output to the external space from the glass substrate is directed from the side on which the refractive index is higher to the side on which the refractive index is lower. The light is totally reflected at an interface between the glass substrate and the external space, and by the influence thereof, a phenomenon that the light extraction efficiency is decreased occurs. In order to avoid this, it has been proposed to provide microlenses on the light emitting elements. Such a technology is disclosed in, for example, Japanese Laid-Open Patent Publications Nos. 2000-322000 and 2004-039500.

OLEDs are easily damaged by moisture. In the case where the above-described technology is used, the OLEDs may be exposed to moisture in a process of producing microlenses on the OLEDs.

The present invention has an object of, even in the case where microlenses are formed to increase the light extraction efficiency, decreasing damage on an OLED caused by the production of the microlenses.

SUMMARY

Provided according to an embodiment of the present invention is a display device including a first substrate; light emitting elements provided on the first substrate and located in correspondence with pixels arrayed in a matrix; a second substrate; a light collection layer provided on the second substrate and including, on the side facing the light emitting elements, at least one convex lens in correspondence with each of the pixels; and a light-transmissive layer that is provided between the first substrate and the second substrate so as to be in contact with the lens and has a refractive index lower than that of the light collection layer.

Provided according to an embodiment of the present invention is a display device including a first substrate; light emitting elements provided on the first substrate and located in correspondence with pixels arrayed in a matrix; a second substrate; a light collection layer provided on the second substrate and including, on the side facing the light emitting elements, at least one concave lens in correspondence with each of the pixels; and a light-transmissive layer that is provided between the first substrate and the second substrate so as to be in contact with the lens and has a refractive index higher than that of the light collection layer.

The lens of the light collection layer may be formed of a color resist.

The display device may further include an assisting layer having a light transmittance higher than that of the color resist, the assisting layer being provided on the color resist on the side opposite from the light emitting elements, in an area corresponding to a projecting portion of a surface of the color resist.

The display device may further include a color resist provided between the light collection layer and the second substrate; and the lens of the light collection layer may be formed of a material having a light transmittance higher than that of the color resist.

The light collection layer may include an area where a plurality of the lenses are located in a houndstooth check pattern.

The light-transmissive layer may include a filler filling a space between the first substrate and the second substrate.

DESCRIPTION OF EMBODIMENTS

Figure 1:
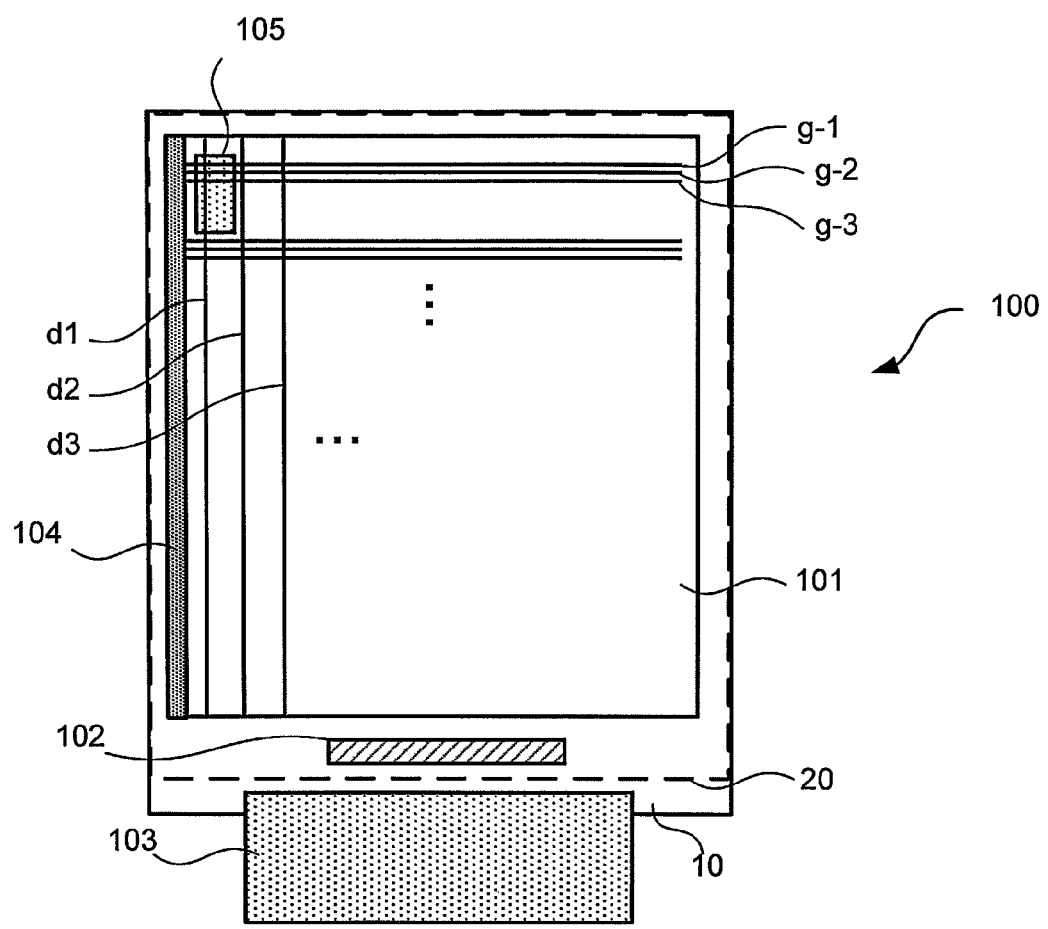
FIG. 1 is a plan view showing a schematic structure of a display device in an embodiment according to the present invention.

Hereinafter, display devices in embodiments of the present invention will be described with reference to the drawings.

The following embodiments are merely examples of the present invention. The present invention is not to be interpreted as being limited to any of the following embodiments, and may be carried out in various modifications. In the drawings referred to below, elements that are identical or have substantially the same functions will bear identical or similar reference numerals (same reference numerals with A, B or the like attached thereto), and the same description may not be repeated. The ratio among sizes of various elements in the drawings may be different from the actual ratio, or a part of the elements may be omitted from the drawings. The expression "provided (formed) on the substrate" encompasses a case where an element is provided (formed) in contact with the substrate and also a case where an element is provided (formed) with another element being held between the element and the substrate.

Embodiment 1

Schematic Structure

FIG. 1 is a plan view showing a schematic structure of a display device 100 in an embodiment according to the present invention. The display device 100 includes a display area 101, a driver IC 102, an FPC (Flexible Printed Circuit) 103, and a scanning line driving circuit 104. The driver IC 102 and the scanning line driving circuit 104 are formed on a first substrate 10.

In the display area 101, a plurality of control signal lines g-1 through g-3 running in a lateral direction in the figure and a plurality of data signal lines d1 through d3 running in a longitudinal direction in the figure are located so as to intersect each other. At positions corresponding to the intersections of the control signal lines g-1 through g-3 and the data signal lines d1 through d3, a plurality of pixels 105 are located respectively. Thus, the plurality of pixels 105 are arrayed in a matrix. FIG. 1 shows, as an example, a structure in which three control signal lines g-1 through g-3 and one data signal line d1 cross each other for each of the pixels 105. The present invention is not limited to having such a structure. Although not shown, a line that supplies a constant voltage such as a power supply line or the like may be provided in the display area 101. In each pixel 105, a pixel circuit is located. The pixel circuit includes a thin film transistor that controls light emission from the pixel 105 by controlling write of a data voltage to be supplied to the pixel 105 in accordance with the control signal supplied from the control signal lines g-1 through g-3, and a capacitor that retains the data voltage supplied from any one of the data signal lines d1 through d3.

A second substrate 20 has a color filter, a light blocking member and the like provided thereon and is attached to the first substrate 10 so as to cover the pixel circuit in each pixel 105. In this example, a space between the first substrate 10 and the second substrate 20 is filled with a filler (see FIG. 4).

Figure 2:
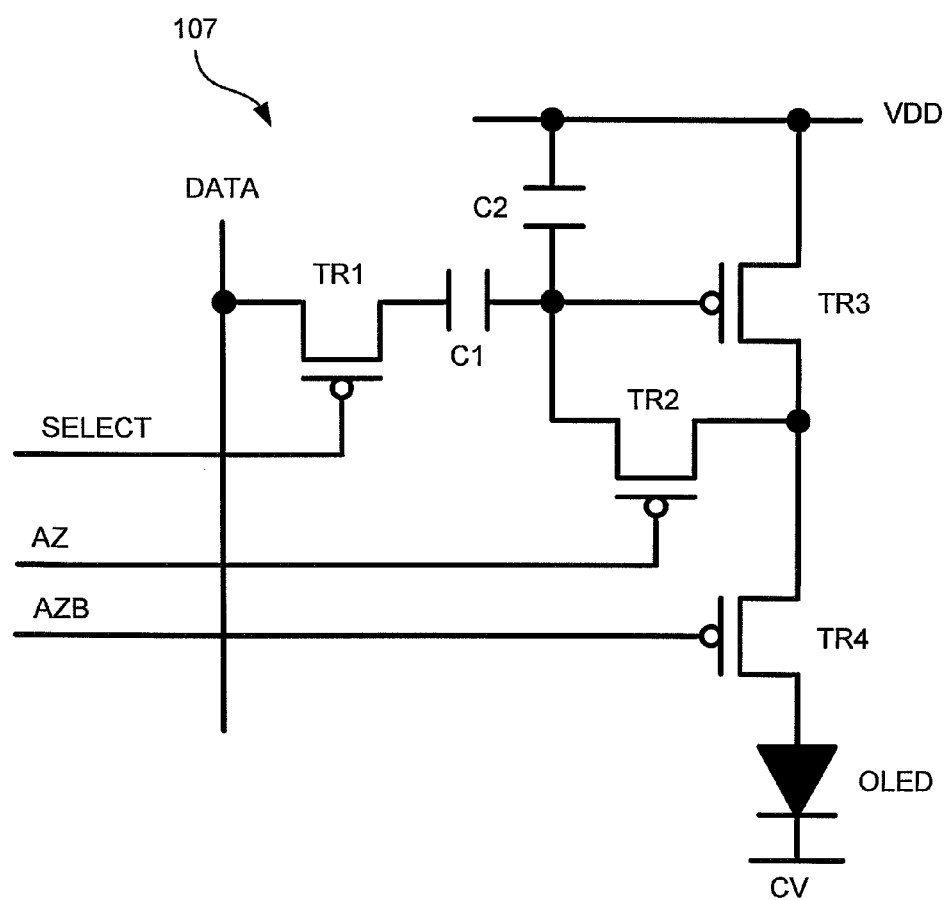
FIG. 2 is a circuit diagram showing an example of pixel circuit usable in a display device in an embodiment according to the present invention.

FIG. 2 shows an example of pixel circuit usable for a display device in an embodiment according to the present invention. Hereinafter, a display device including OLEDs will be described as the display device 100. The display device in an embodiment according to the present invention may be any display device including light emitting elements that emit light at intensity in accordance with the supplied electric current, and is not limited to using OLEDs.

As shown in FIG. 2, a pixel circuit 107 in each pixel 105 includes, for example, four transistors TR1 through TR4, two capacitors C1 and C2, and an OLED. One of a source terminal and a drain terminal of the transistor TR1 is connected to a data signal line DATA (data signal line d1 shown in FIG. 1), and the other of the source terminal and the drain terminal of the transistor TR1 is connected to one of terminals of the capacitor C1. A gate terminal of the transistor TR1 is connected to a scanning line SELECT (control signal line g-1 shown in FIG. 1).

One of a source terminal and a drain terminal of the transistor TR2 is commonly connected to the other terminal of the capacitor C1, one of terminals of the capacitor C2 and a gate terminal of the transistor TR3. The other of the source terminal and the drain terminal of the transistor TR2 is commonly connected to one of a source terminal and a drain terminal of the transistor TR3 and one of a source terminal and a drain terminal of the transistor TR4. A gate terminal of the transistor TR2 is connected to a control signal line AZ (control signal line g-2 shown in FIG. 1).

The other of the source terminal and the drain terminal of the transistor TR4 is connected to a positive electrode of the OLED, and a gate terminal of the transistor TR4 is connected to a control signal line AZB (control signal line g-3 shown in FIG. 1). A negative electrode of the OLED is supplied with a power supply voltage CV, and the other of the source terminal and the drain terminal of the transistor TR3 and the other terminal of the capacitor C2 are supplied with a power supply voltage VDD.

The pixel circuit 107 having such a structure causes, for example, the capacitors C1 and C2 to retain the voltage to compensate for the dispersion in the threshold voltage of the transistor TR3, and thus can cause the OLED to emit light at a luminance in accordance with the data voltage supplied from the data signal line DATA. Therefore, the pixel circuit 107 having the structure shown in FIG. 2 can decrease the influence of the dispersion in the transistor characteristics on display.

Figure 3:
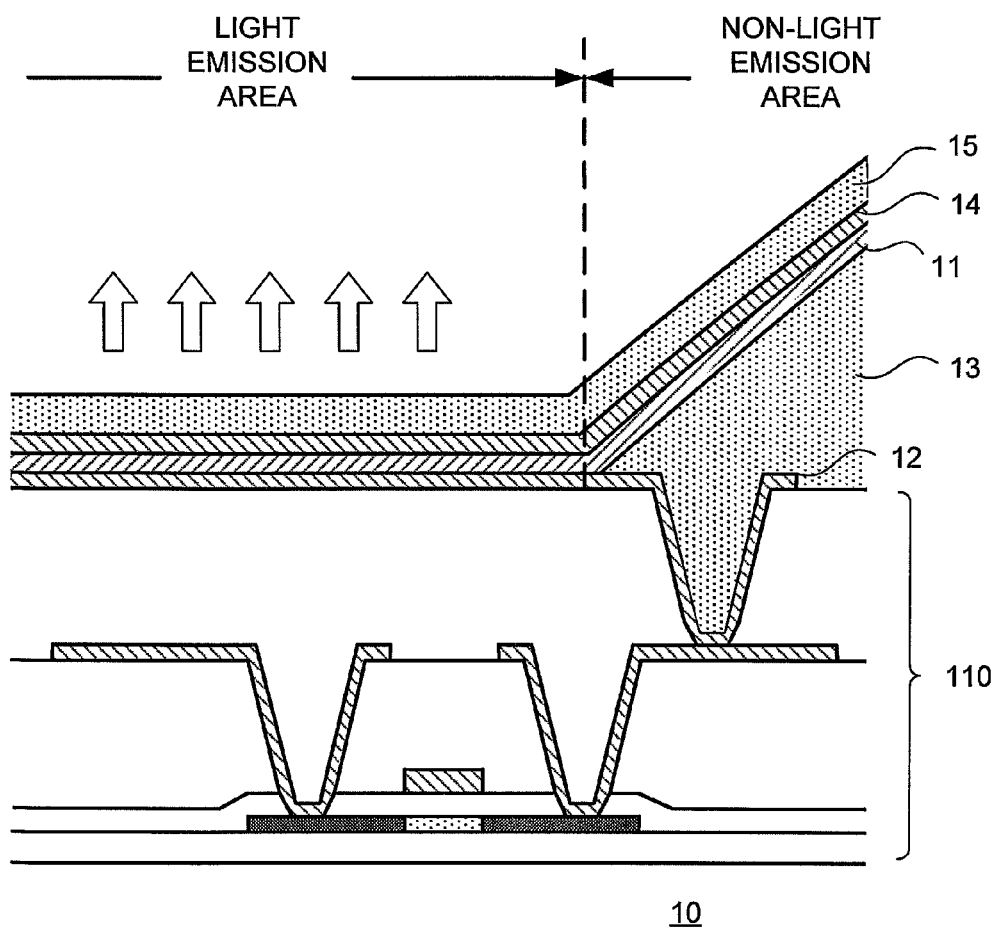
FIG. 3 is a schematic view showing a cross-sectional structure on the side of a first substrate of a display device in an embodiment according to the present invention.

FIG. 3 is a schematic view showing a cross-sectional structure on the first substrate 10 side of a display device in an embodiment according to the present invention. On the first substrate 10, a transistor unit 110 corresponding to the transistor TR4 is formed. The transistor unit 110 shown in FIG. 3 corresponds to the transistor TR4, and transistor units corresponding to the other transistors are omitted from FIG. 3. The transistor unit 110 includes a flattening film, which has a contact hole formed therein. An anode electrode 12 is formed along the contact hole. A bank 13 is formed to fill the contact hole and isolate the pixel shown in FIG. 3 from an adjacent pixel.

Above the anode electrode 12, a light emitting element 11 including an OLED is formed. On the light emitting element 11, a cathode electrode 14 is formed. In this example, the OLED outputs white light when an electric current is supplied from the anode electrode 12 to the cathode electrode 14. Therefore, the OLED emits light in an area between the anode electrode 12 and the cathode electrode 14, and does not emit light in any other area. Color filters are used to allow the white light to have other colors (e.g., RGB colors, RGBW colors, etc.). OLEDs in all the pixels in the display device 100 may emit white light, which is allowed to have RGB colors by use of the color filters; or alternatively, the display device 100 may use a "side-by-side RGB sub-pixel system".

On the cathode electrode 14, a sealing film 15 is formed. In this example, the sealing film 15 is formed of silicon nitride ($SiN_x$). In this example, the display device 100 is of a so-called top emission structure, in which white light is directed in a direction opposite from a direction toward the transistor unit 110 (directed upward in the figure) and is output from the second substrate 20. Therefore, the cathode electrode 14 is formed to be light-transmissive. The white light emitted from the light emitting element 11 is transmitted through a color filter formed of a color resist provided on the second substrate 20 to become light of a color (in this example, any of three colors of red (R), green (G) and blue (B)) and is output outside from the second substrate 20.

Now, the structure of a display device in a conventional example and problems thereof will be described. Then, the elements provided on the second substrate 20 and the like will be described.

Conventional Example

Figure 14:
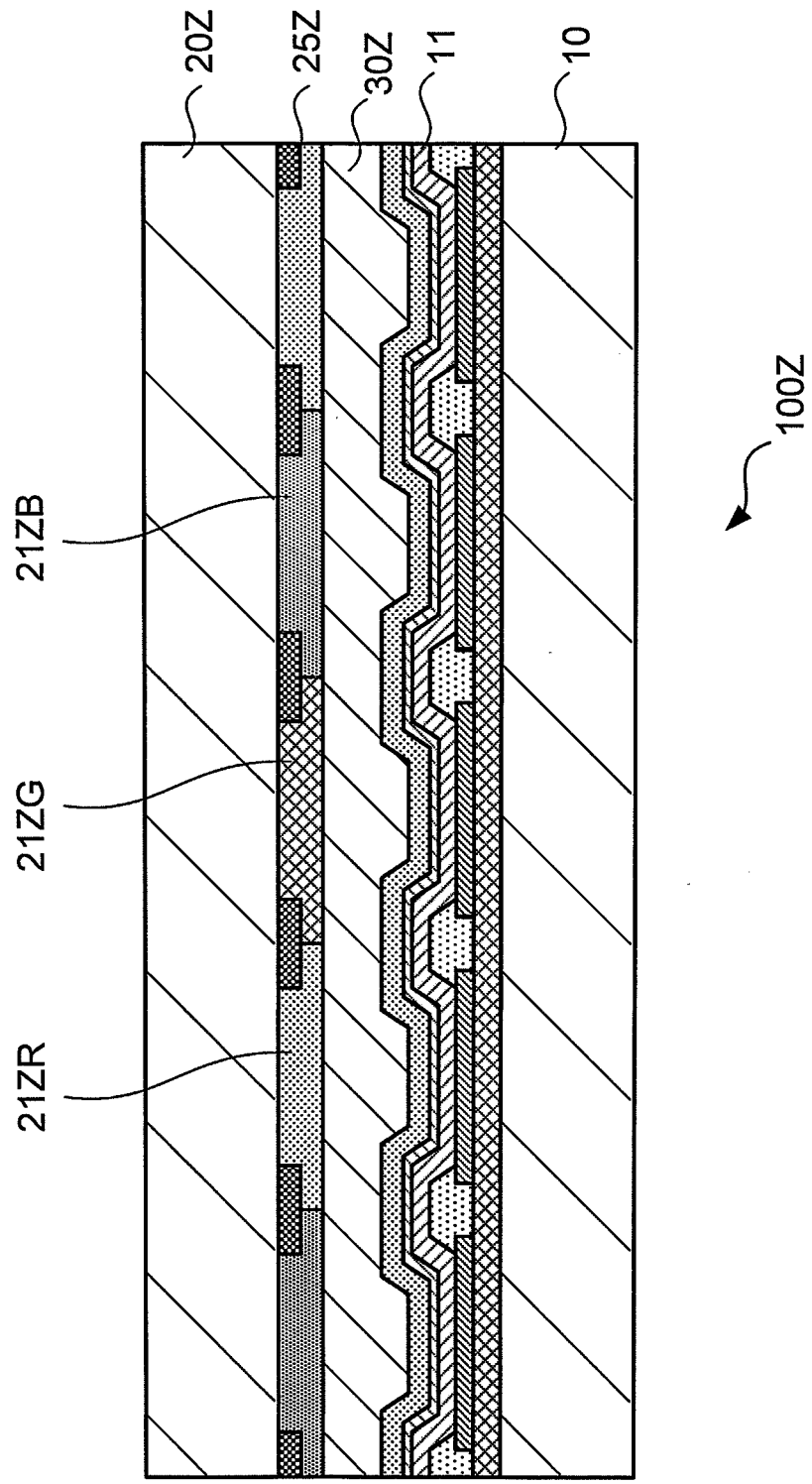
FIG. 14 is a schematic view showing a cross-sectional structure of a display device in a conventional example.

FIG. 14 is a schematic view showing a cross-sectional structure of a display device in a conventional example. On a second substrate 20Z, a light blocking member 25Z and color filters 21ZR, 21ZG and 21ZB corresponding to red (R), green (G) and blue (B) are provided. A space between the second substrate 20Z and the first substrate 10 is filled with a filler 30Z. In the conventional example, the color filters 21ZR, 21ZG and 21ZB are formed to have a flat surface.

Figure 15:
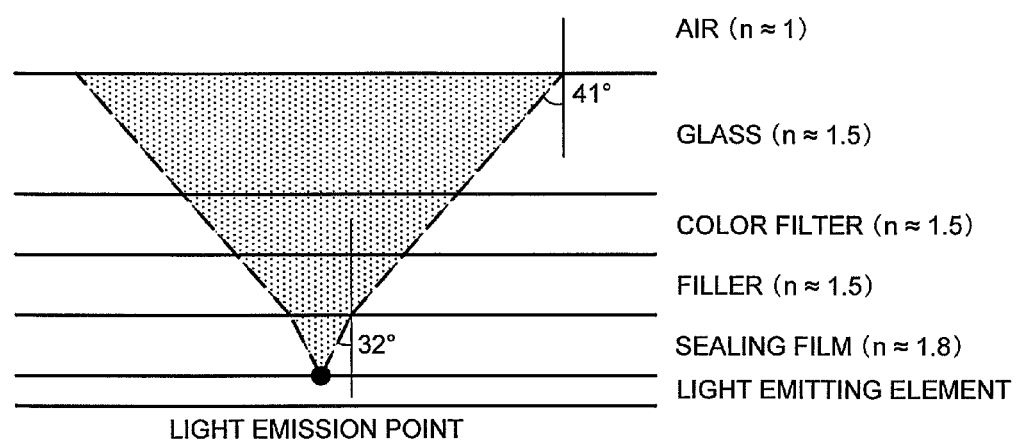
FIG. 15 is provided to explain why the light extraction efficiency is decreased in the display device in the conventional example.

FIG. 15 is provided to explain why the light extraction efficiency is decreased in the display device 100Z in the conventional example. FIG. 15 shows a film structure through which light emitted from the light emitting element 11 runs in the structure shown in FIG. 14. In FIG. 15, a cathode electrode 14 formed on the light emitting element 11 is omitted in consideration of the thickness or the like thereof. In the conventional example, the filler, the color filter and the second substrate (glass) have substantially the same refractive index ($n \approx 1.5$) as each other, and the refractive index of a sealing film ($n \approx 1.8$) is significantly different from the refractive index of the other elements.

As shown in FIG. 15, in the case where the light is directed toward the air from the glass substrate, the light is totally reflected and is not output outside when the angle of incidence exceeds 41° due to the difference in the refractive index between the glass and the air. The sealing film is formed of silicon nitride or the like, and thus the refractive index thereof is relatively high ($n \approx 1.8$). In consideration of this refractive index, the angle of incidence on the filler from the sealing film needs to be less than 32° in order to avoid the angle of incidence on the air from the glass from being 41° or greater. Therefore, when the angle of incidence (hereinafter, may be referred to as "outgoing angle from the light emitting element 11") is 32° or greater, the light cannot be output outside from the glass, and this component of the light is wasted. According to the present invention, as described later, the range of outgoing angles of the light from the light emitting element 11 at which the light is not totally reflected and is output outside can be broadened as compared with in the conventional example, and thus the wasted component of the light can be decreased.

[Structure on the Second Substrate Side]

Figure 4:
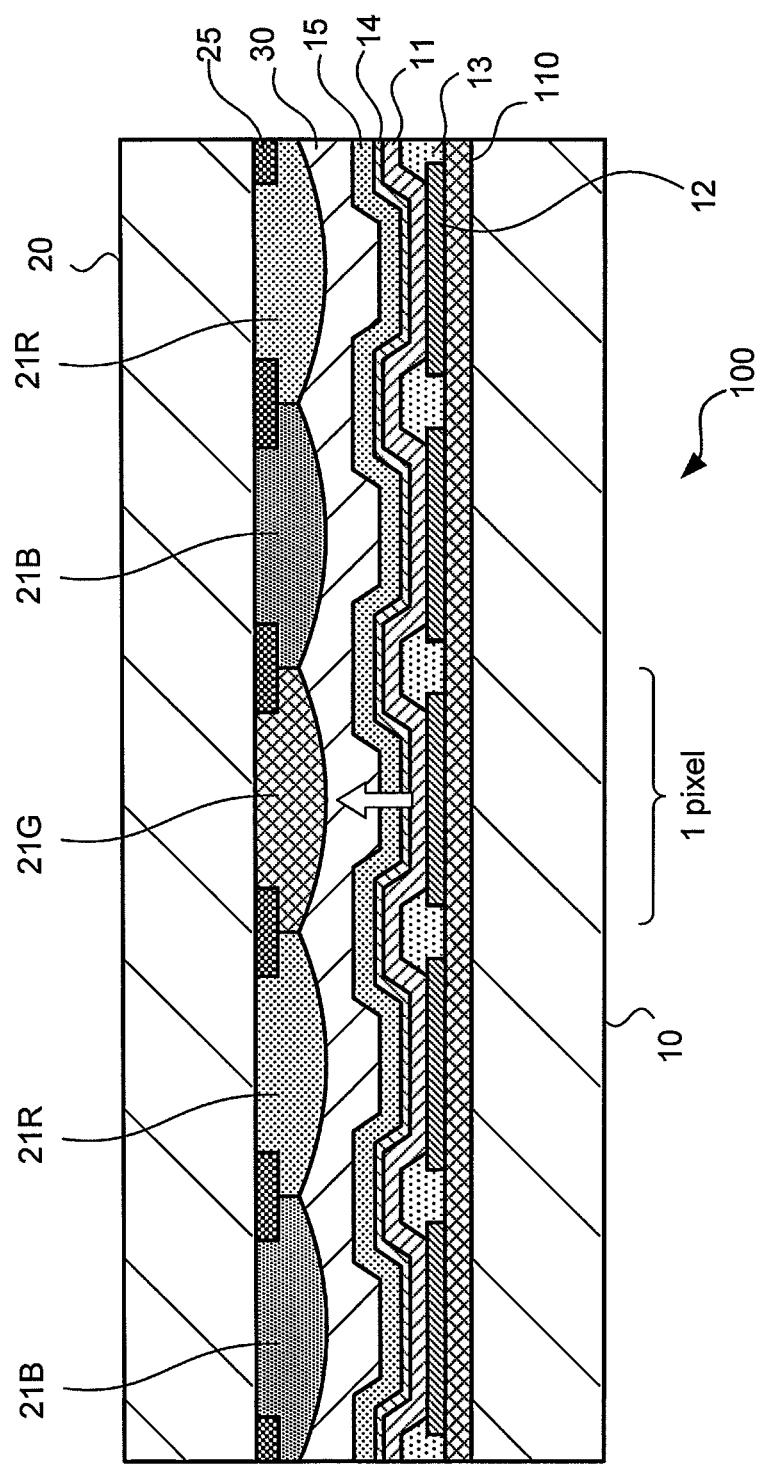
FIG. 4 is a schematic view showing a cross-sectional structure of a display device in Embodiment 1 according to the present invention.

FIG. 4 is a schematic view showing a cross-sectional structure of the display device 100 in Embodiment 1 according to the present invention. In FIG. 4, the reference numerals used in the above description regarding FIG. 3 represent the same elements as above.

In this example, the second substrate 20 is formed of glass. On the second substrate 20, a light blocking member 25 and color filters 21R, 21G and 21B corresponding to red (R), green (G) and blue (B) are provided. In the following description, in the case where it is not intended to specify any of the colors of the color filters, the color filters will be referred to as the "color filters 21". The light blocking member 25 is formed of a light blocking material such as a metal material or the like. In this example, the light blocking member 25 is formed at borders between pixels of different colors, and is located in stripes. The light blocking member 25 may be formed at all the borders between adjacent pixels.

The color filters 21 are formed of color resists and provided between striped portions of the light blocking member 25. The color filters 21 desirably have a refractive index lower than that of the second substrate 20, but the refractive index of the color filters 21 may be equal to, or higher than, that of the second substrate 20. The color filters 21 are formed to have a convex-lens-shaped surface on the side facing the light emitting elements 11. Namely, the color filters 21 form a light collection layer that includes convex lenses projecting toward the light emitting elements 11 and collects the light from the light emitting elements 11.

In this example, the color filter 21 in each pixel is formed such that a part thereof corresponding to a peripheral area of the pixel is thinnest as seen from the second substrate 20 side. The color filters 21 may be convexed along at least one direction of the plane in which the pixels are arrayed in a matrix and may not be convexed along another direction of the plane. In an example of such a structure, the color filters 21 may be formed to be thinnest on the light blocking member 25 located in stripes, namely, may be formed to form cylindrical lenses.

The color filters 21 are formed by patterning color resists by photolithography. In the process of photolithography, the convex lenses are formed by controlling the exposure amount stepwise by use of a half tone mask in an exposure step or by controlling the time duration, the temperature or the like of development performed by use of a developer. This method for producing the convex lenses is merely an example, and any other method is usable as long as the color filters 21 are formed to have a convex-lens-shaped surface.

The space between the second substrate 20 and the first substrate 10 is filled with a filler 30. The filler 30 is in contact with the color filters 21. The filler 30 is formed of a light-transmissive resin or the like and forms a light-transmissive layer. The material used to form the filler 30 has a refractive index lower than that of the color filters 21.

In the step of attaching the first substrate 10 having the elements shown in FIG. 3 provided thereon and the second substrate 20 having the light blocking member 25 and the color filters 21 provided thereon to each other, the filler 30 is injected into a space between the first substrate 10 and the second substrate 20. In the example shown in FIG. 4, the surface of the color filters 21 is in contact with the filler 30. Another layer formed of a light-transmissive material may be provided between the color filters 21 and the filler 30. For example, an overcoat layer formed of a light-transmissive resin or the like having a refractive index lower than that of the color filters 21 may be provided on the surface of the color filters 21. Alternatively, there may be a space on the surface of the color filters 21. Even such a structure can be regarded as including a light-transmissive layer having a refractive index of about 1.

Since the refractive index of the filler 30 in contact with the color filters 21 is lower than that of the color filters 21, the color filters 21 collect light from the light emitting elements 11 owing to the convex lens shape thereof. As a result, the range of outgoing angles at which the light emitted from each light emitting element 11 is not totally reflected and is output outside can be broadened as compared with in the conventional example. Therefore, the ratio of the light component totally reflected with respect to the light emitted from each light emitting element 11 can be decreased, and the light extraction efficiency is increased.

Even in the case where the microlenses are formed to increase the light extraction efficiency, the damage on the OLEDs caused by the production of the microlenses can be alleviated because the microlenses are formed as a part of the color filters 21 that are provided on the second substrate 20, not on the first substrate 10 on which the OLEDs are provided.

Embodiment 2

In Embodiment 1, in the color filters 21, one convex lens is formed in each pixel. In Embodiment 2, a structure in which a plurality of convex lenses are formed in each pixel will be described with reference to FIG. 5 and FIG. 6.

Figure 5:
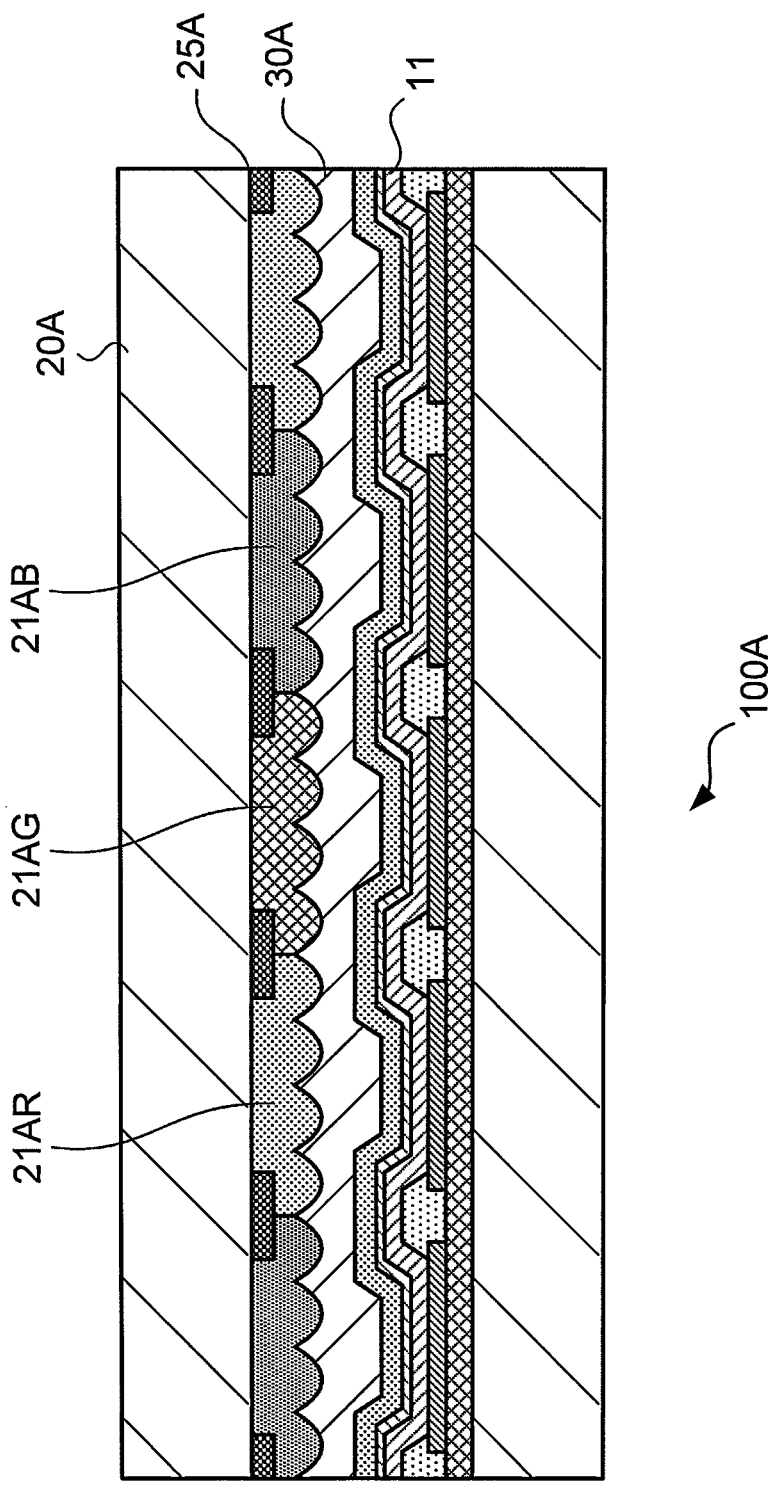
FIG. 5 is a schematic view showing a cross-sectional structure of a display device in Embodiment 2 according to the present invention.

FIG. 5 is a schematic view showing a cross-sectional structure of a display device 100A in Embodiment 2 according to the present invention. The display device 100A includes color filters 21AR, 21AG and 21AB located between striped portions of a light blocking member 25A located on a second substrate 20A. The color filters 21AR, 21AG and 21AB each have a convex-lens-shaped surface in contact with a filler 30A, and a plurality of convex lenses are formed in each pixel. In this example also, the filler 30A has a refractive index lower than that of the color filters 21AR, 21AG and 21AB.

Figure 6:
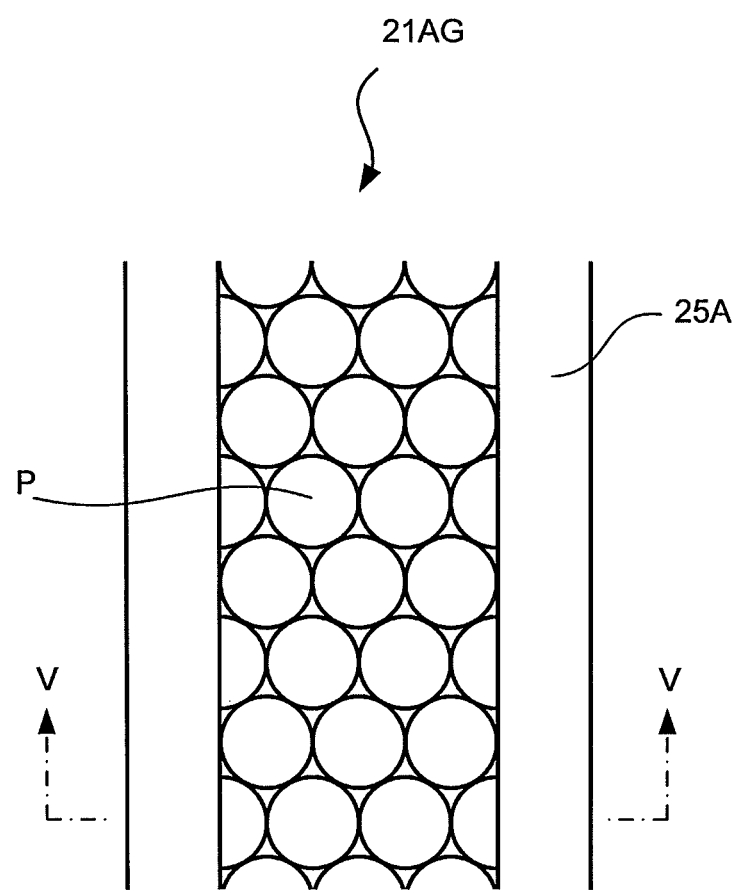
FIG. 6 shows a positional arrangement of convex lenses in Embodiment 2 according to the present invention.

FIG. 6 is provided to explain a positional arrangement of the convex lenses in Embodiment 2. FIG. 6 shows the positional relationship between the light blocking member 25A and the color filter 21AG as seen from the second substrate 20A in FIG. 5. As shown in FIG. 6, each of convex portions P (the two-dimensional shape of each of the convex portions P) of the color filter 21AG is circular. The convex portions P are located in a houndstooth check pattern; namely, adjacent lines of the convex portions P are shifted by half a pitch. An arrangement in which many lenses are located in each pixel in this manner can increase the curvature of the convex portions. This further increases the extraction efficiency of light from the light emitting element 11 to the outside of the display device 100A. This is also applicable to the color filters 21AR and 21AB. FIG. 5 is a cross-sectional view of FIG. 6 taken along line V-V in FIG. 6.

The two-dimensional shape of the convex portions P does not need to be circular, and may be elliptical, rectangular or the like. The plurality of convex portions P do not need to be located at a most dense state like in the houndstooth check pattern. There may be an area where no convex portion P is present, or the convex portions P do not need to be located regularly.

Embodiment 3

In Embodiment 1, in the color filters 21, one convex lens is formed in each pixel. In Embodiment 3, a structure in which a concave lens is formed in each pixel will be described with reference to FIG. 7.

Figure 7:
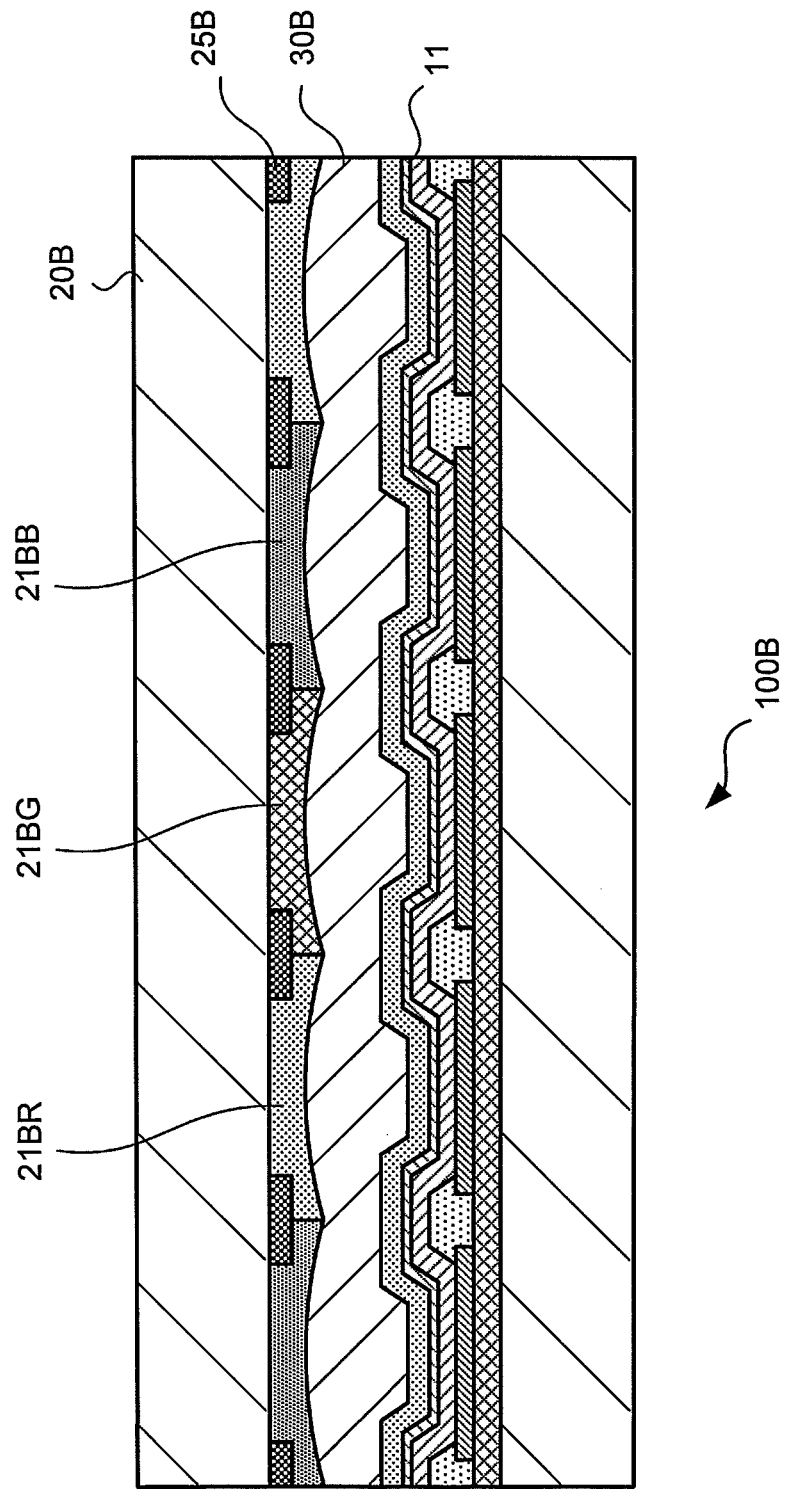
FIG. 7 is a schematic view showing a cross-sectional structure of a display device in Embodiment 3 according to the present invention.

FIG. 7 is a schematic view showing a cross-sectional structure of a display device 100B in Embodiment 3 according to the present invention. The display device 100B includes color filters 21BR, 21BG and 21BB located between striped portions of a light blocking member 25B located on a second substrate 20B. In this example, the filler 30B has a refractive index higher than that of the color filters 21BR, 21BG and 21BB. The color filters 21BR, 21BG and 21BB each have a concave-lens-shaped surface in contact with a filler 30B. Therefore, the color filters 21BR, 21BG and 21BB form a light collection layer that collects the light from the light emitting elements 11, like the color filters 21 in Embodiment 1.

In the case where the filler 30B is formed of a material having a refractive index higher than that of the color filters 21BR, 21BG and 21BB, the extraction efficiency of light from the light emitting elements 11 to the outside of the display device 100B can be increased as compared with in the conventional example by forming the color filters 21BR, 21BG and 21BB having a concave-lens-shaped surface.

Embodiment 4

In Embodiment 3, in the color filters 21, one concave lens is formed in each pixel. In Embodiment 4, a structure in which a plurality of concave lenses are formed in each pixel will be described with reference to FIG. 8.

Figure 8:
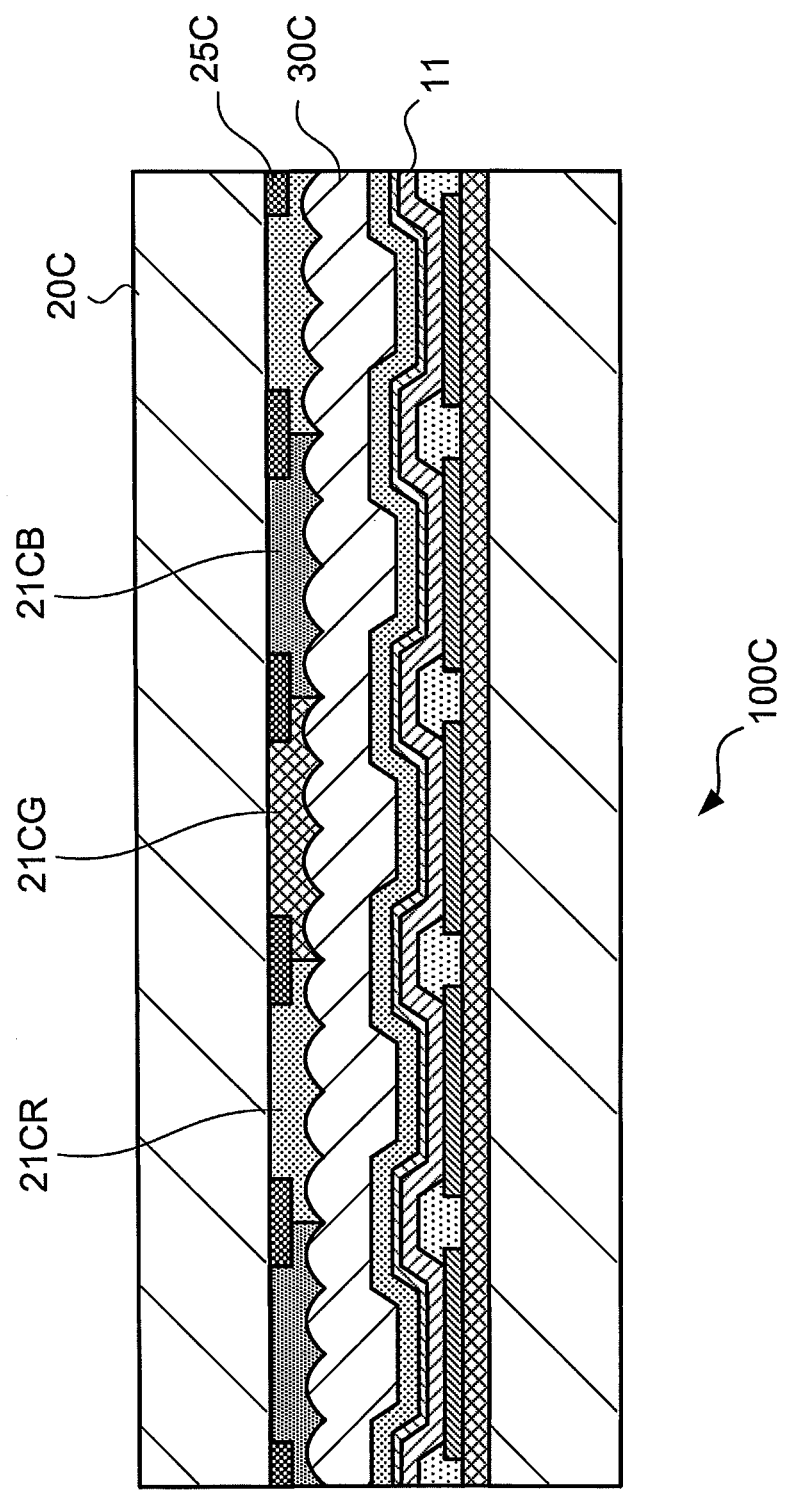
FIG. 8 is a schematic view showing a cross-sectional structure of a display device in Embodiment 4 according to the present invention.

FIG. 8 is a schematic view showing a cross-sectional structure of a display device 100C in Embodiment 4 according to the present invention. The display device 100C includes color filters 21CR, 21CG and 21CB located between striped portions of a light blocking member 25C located on a second substrate 20C. The color filters 21CR, 21CG and 21CB each have a concave-lens-shaped surface in contact with a filler 30C, and a plurality of concave lenses are formed in each pixel. In this example also, the filler 30C has a refractive index higher than that of the color filters 21CR, 21CG and 21CB. In this example, as seen from the second substrate 20C, the light blocking member 25C and the color filter 21CG have the same positional relationship as that of the light blocking member 25A and the color filter 21AG shown in FIG. 6, and concave portions of the color filter 21CG are located in a houndstooth check pattern also as shown in FIG. 6.

The two-dimensional shape of the concave portions does not need to be circular, and may be elliptical, rectangular or the like. The plurality of concave portions do not need to be located at a most dense state like in the houndstooth check pattern. There may be an area where no concave portion is present, or the concave portions do not need to be located regularly.

Embodiment 5

In Embodiment 5, a structure in which a light-transmissive assisting layer is provided between the color filters and the second substrate will be described with reference to FIG. 9 and FIG. 10.

Figure 9:
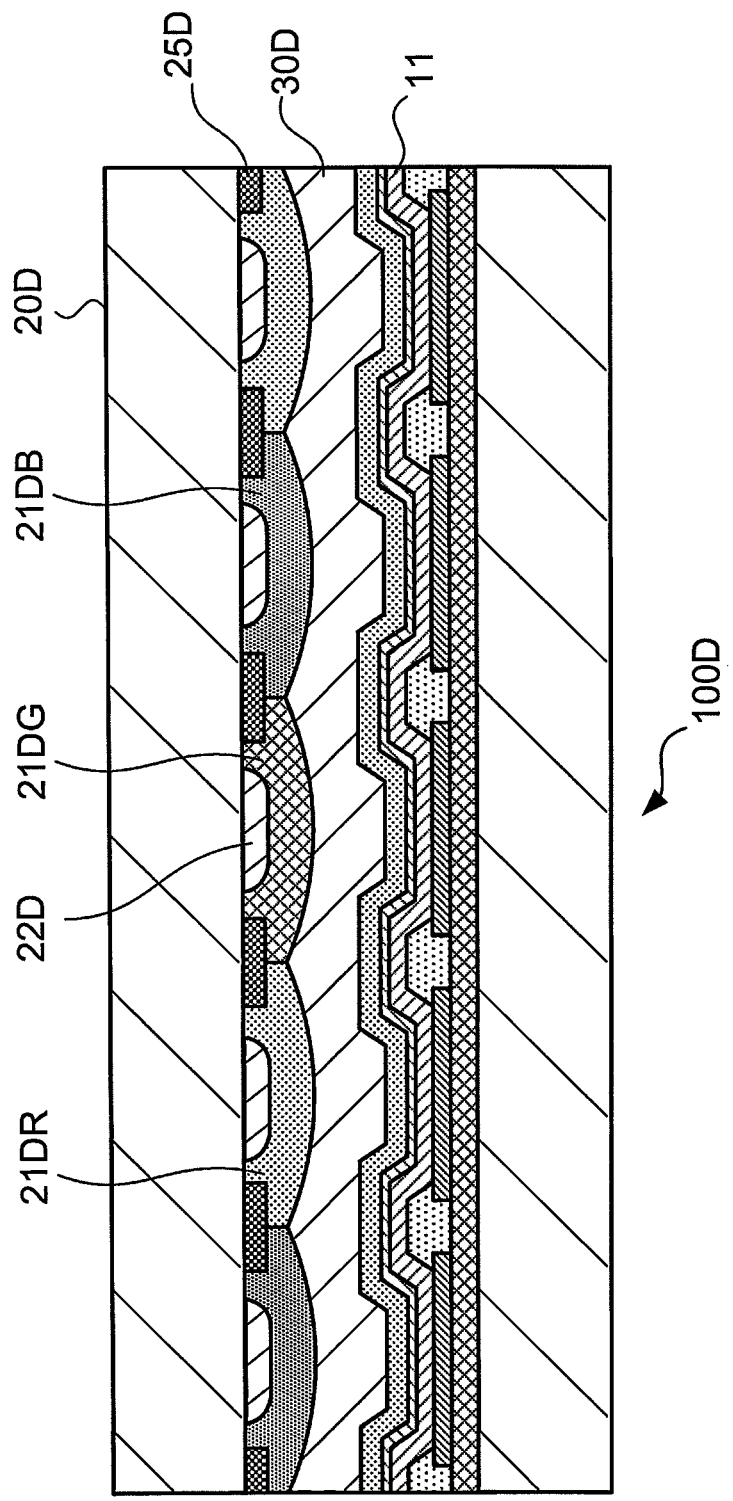
FIG. 9 is a schematic view showing a cross-sectional structure of a display device in Embodiment 5 according to the present invention.

FIG. 9 is a schematic view showing a cross-sectional structure of a display device 100D in Embodiment 5 according to the present invention. The display device 100D includes color filters 21DR, 21DG and 21DB located between striped portions of a light blocking member 25D located on a second substrate 20D. The color filters 21DR, 21DG and 21DB each have a convex-lens-shaped surface in contact with a filler 30D. In this example, the display device 100D includes an assisting layer 22D provided on the color filters 21DR, 21DG and 21DB on the side facing the second substrate 20D (the side opposite from the light emitting elements 11). The assisting layer 22D is provided in correspondence with the projecting portions of the convex lenses of the color filters 21DR, 21DG and 21DB. The assisting layer 22D is formed of a material having a light transmittance higher than that of the color resists used to form the color filters 21DR, 21DG and 21DB. It is desirable that the assisting layer 22D has a refractive index that is closer to the refractive index of the color filters 21DR, 21DG and 21DB than that of the filler 30D, and the refractive index of the assisting layer 22D may be equal to, or higher than, that of the color filters 21DR, 21DG and 21DB. The assisting layer 22D is formed by patterning by use of photolithography before the color filters 21DR, 21DG and 21DB are formed.

Figure 10:
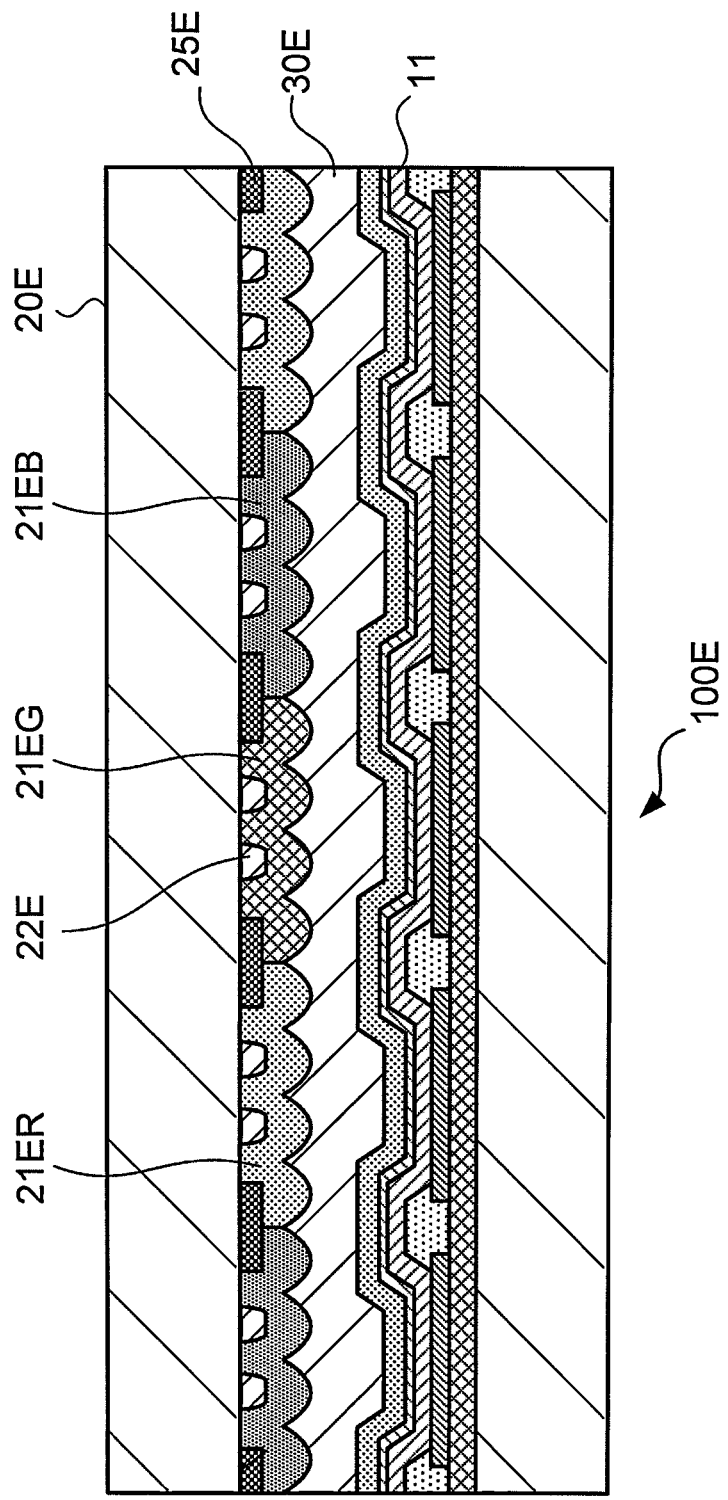
FIG. 10 is a schematic view showing a cross-sectional structure of a display device in another example of Embodiment 5 according to the present invention.

FIG. 10 is a schematic view showing a cross-sectional structure of a display device 100E in another example of Embodiment 5 according to the present invention. In FIG. 9, the assisting layer is added to the structure of Embodiment 1. In FIG. 10, the assisting layer is added to the structure of Embodiment 2. The display device 100E includes color filters 21ER, 21EG and 21EB located between striped portions of a light blocking member 25E located on a second substrate 20E. The color filters 21ER, 21EG and 21EB each have a convex-lens-shaped surface in contact with a filler 30E, and a plurality of lenses are formed in each pixel. In this example, the display device 100E includes an assisting layer 22E provided on the color filters 21ER, 21EG and 21EB on the side facing the second substrate 20E (the side opposite from the light emitting elements 11). The assisting layer 22E is provided in correspondence with the projecting portions of the convex lenses of the color filters 21ER, 21EG and 21EB. The assisting layer 22E is formed of a material having a light transmittance higher than that of the color resists used to form the color filters 21ER, 21EG and 21EB. It is desirable that the assisting layer 22E has a refractive index that is closer to the refractive index of the color filters 21ER, 21EG and 21EB than that of the filler 30E, and the refractive index of the assisting layer 22E may be equal to, or higher than, that of the color filters 21ER, 21EG and 21EB.

Since the color filters include the convex lenses, the thickness of the color resists is different at the projecting portion at the center of each lens from in the peripheral area thereof. Therefore, the light from each light emitting element 11 that is incident on the projecting portion of the lens and the light from the same light emitting element 11 that is incident on the peripheral area of the lens advance on different routes. This may influence the color purity, the color distribution, the luminance or the like. However, in Embodiment 5, an assisting layer having a light transmittance higher than that of the color resists is provided and thus the thickness of the color resists at the projection portion of the lens is decreased. Therefore, the thickness difference in the color resists between the projecting portion and the peripheral area of the lens can be decreased, and the above-described influence caused by the thickness difference can be alleviated.

It is desirable that the assisting layer 22D has a convex-lens-shaped surface like the color filters 21DR, 21DG and 21DB. In this manner, the thickness difference in the color filters 21DR, 21DG and 21DB between the projection portion (at the center of the lens) and the peripheral area of the lens can be further decreased.

The assisting layer may be provided even in the case where the color filters including the concave lenses are used as in Embodiment 3 and Embodiment 4. The concave lenses are each projected in the peripheral area. The assisting layer may be provided in correspondence with such peripheral areas. The assisting layer does not need to be provided in the area where the light blocking member is provided. In the case of, for example, Embodiment 3 shown in FIG. 7, the assisting layer does not need to be provided on the light blocking member 25B, and may be provided only along the border between adjacent pixels where the light blocking member is not provided.

It is desirable that the assisting layer 22E has a convex-lens-shaped surface like the color filters 21EA, 21EG and 21EB. In this manner, the thickness difference in the color filters 21ER, 21EG and 21EB between the projection portion (at the center of the lens) and the peripheral area of the lens can be further decreased.

Embodiment 6

In Embodiment 6, a structure in which the convex lenses are realized by a member different from the color filters will be described with reference to FIG. 11.

Figure 11:
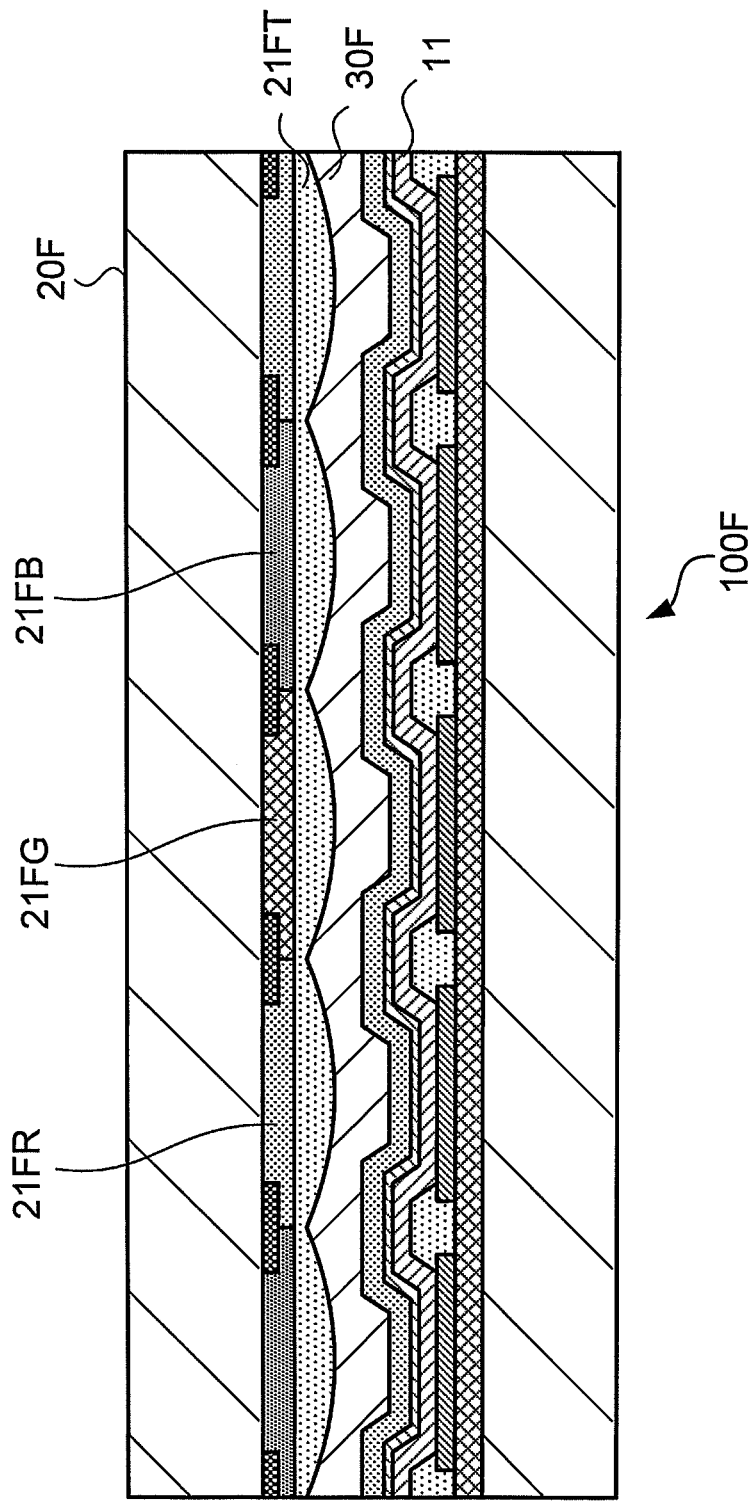
FIG. 11 is a schematic view showing a cross-sectional structure of a display device in Embodiment 6 according to the present invention.

FIG. 11 is a schematic view showing a cross-sectional structure of a display device 100F in Embodiment 6 according to the present invention. The display device 100F includes color filters 21FR, 21FG and 21FB located between striped portions of a light blocking member 25F located on a second substrate 20F. The color filters 21FR, 21FG and 21FB have a flat surface on the side facing the light emitting element 11, unlike in the above-described embodiments. The display device 100F includes a lens layer 21FT having a shape of convex lenses. The lens layer 21FT is provided on the color filters 21FR, 21FG and 21FB on the side facing the light emitting element 11, and is in contact with a filler 30F.

The filler 30F has a refractive index lower than that of the lens layer 21FT. In addition, the lens layer 21FT has a convex-lens-shaped surface in contact with the filler 30F. Therefore, the lens layer 21FT acts as a light collection layer that collects light from the light emitting elements 11, like the color filters 21 in Embodiment 1. The refractive index of the lens layer 21FT merely needs to be higher than that of the filler 30F, but is desirably equal to, or lower than, that of the color filters 21FR, 21FG and 21FB.

In Embodiment 6, the lens layer 21FT forms one convex lens in each pixel as shown in FIG. 11. Alternatively, as in Embodiment 2, a plurality of convex lenses may be formed in each pixel. Still alternatively, in the case where the refractive index of the filler 30F is higher than that of the lens layer 21FT as in Embodiment 3 and Embodiment 4, the lens layer 21FT may have a concave-lens-shaped surface.

In the case where the light emitting elements 11 use OLEDs respectively having the three RGB colors, it may not be necessary to use the color filters 21FR, 21FG and 21FB in the structure of Embodiment 6.

Embodiment 7

In Embodiment 7, a case in which a bottom emission structure, instead of the top emission structure, is applied to the display device in Embodiment 5 shown in FIG. 10 will be described with reference to FIG. 12.

Figure 12:
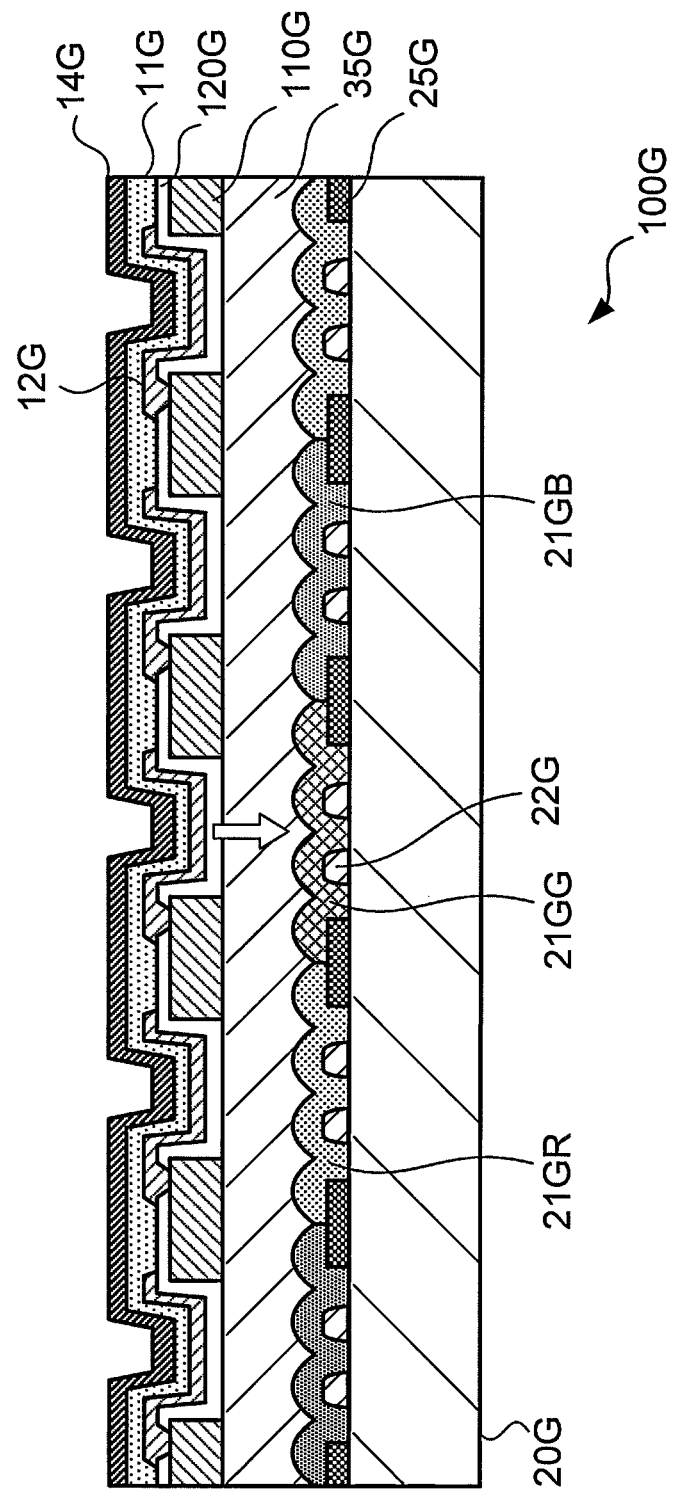
FIG. 12 is a schematic view showing a cross-sectional structure of a display device in Embodiment 7 according to the present invention.

FIG. 12 is a schematic view showing a cross-sectional structure of a display device 100G in Embodiment 7 according to the present invention. The display device 100G includes a light blocking member 25G, an assisting layer 22G and color filters 21GR, 21GG and 21GB which are provided on a second substrate 20G. An insulating layer 35G is formed so as to cover these members. Transistor units 110G, an insulating layer 120G, anode electrodes 12G, light emitting elements 11G, and a cathode electrode 14G are formed on the insulating layer 35G. On the cathode electrode 14G, a sealing film, a sealing substrate or the like may be formed.

As shown in FIG. 12, the color filters 21GR, 21GG and 21GB are convex-lens-shaped on the side facing the light emitting element 11 (the side on which light from the light emitting elements 11 is incident). The insulating layer 35G is formed of a light-transmissive resin or the like having a refractive index lower than that of the color filters 21GR, 21GG and 21GB. Owing to such a structure, the color filters 21GR, 21GG and 21GB form a light collection layer that collects the light from the light emitting elements 11, like the color filters 21 in Embodiment 1.

In Embodiment 7, the bottom emission structure is applied to the display device in Embodiment 5. The bottom emission structure may be applied to the display device in any other embodiment.

Since the color filters including the microlenses are formed before the OLEDs are formed, the damage caused to the OLEDs by the production of the microlenses can be alleviated.

<Definitions of the "Convex Lens Shape" and the "Concave Lens Shape">

In the case where one convex lens or one concave lens is provided in each pixel as in Embodiment 1 or Embodiment 3, whether the lens is a convex lens or a concave lens is clearly appreciated from the shape of the surface of the light collection layer. By contrast, in the case where a plurality of convex lenses or a plurality of concave lenses are continuously provided as in Embodiment 2 or Embodiment 4, it may be difficult to distinguish whether the lenses are convex lenses or concave lenses merely from the shape of the surface of the light collection layer. Thus, the convex lens shape and the concave lens shape will be defined below.

Figure 13:
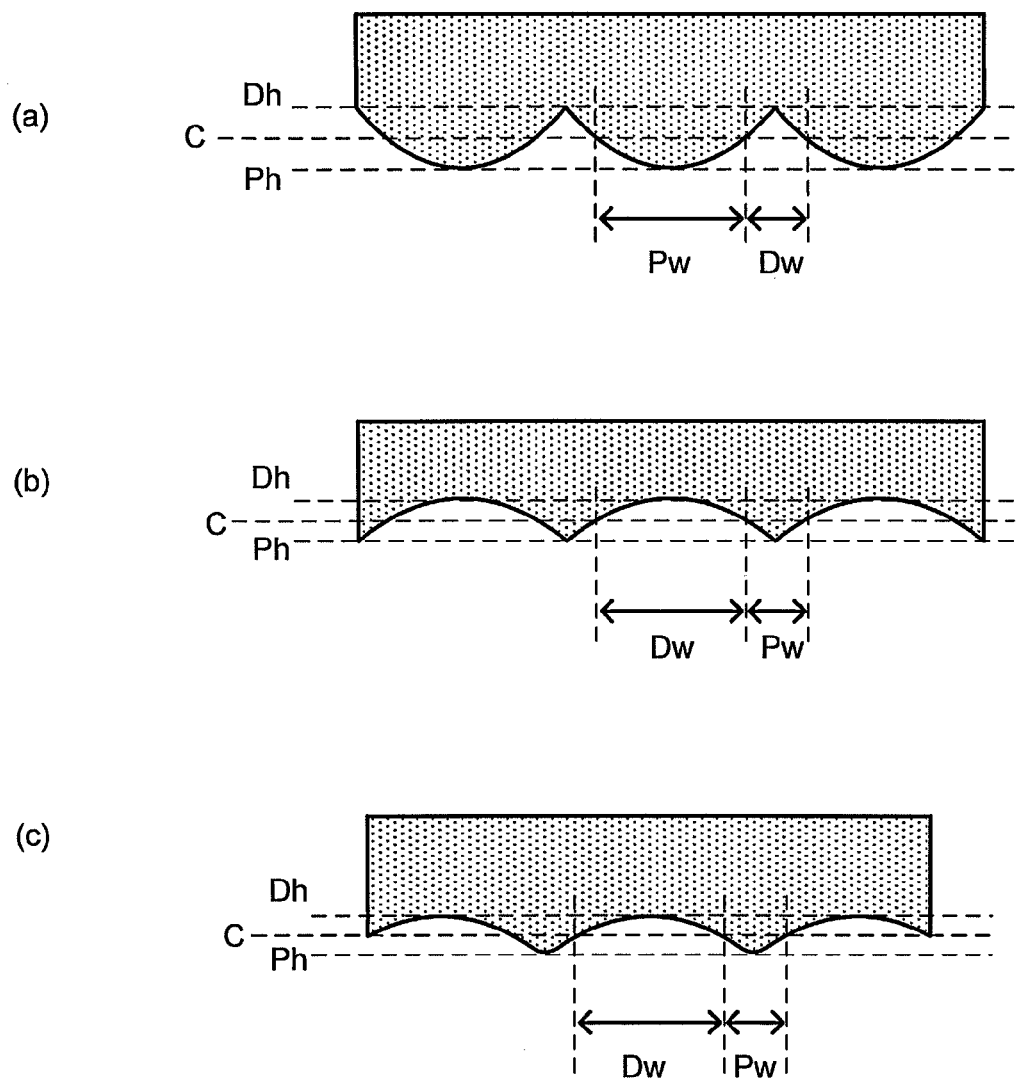
FIG. 13 is provided to explain definitions of a convex lens shape a concave lens shape in an embodiment according to the present invention.

FIG. 13 is provided to explain the definition of the convex lens shape and the concave lens shape in an embodiment according to the present invention. FIG. 13(a) shows the shape of the convex lenses described above in Embodiment 2 with reference to FIG. 5. FIG. 13(b) shows the shape of the concave lenses described above in Embodiment 4 with reference to FIG. 7. In these figures, Dh represents the dip position (uppermost position in the figures), Ph represents the peak position (lowermost position in the figures), and C represents the center position therebetween. At the intermediate position C, the peak width Pw (corresponding to the full width half maximum of the peak) and the dip width Dw of each shape of the lenses are compared with each other. When the peak width Pw is larger than the dip width Dw, the lenses are defined as the convex lenses. When the peak width Pw is smaller than the dip width Dw, the lenses are defined as the concave lenses. With such definitions, the lenses of the light collection layer shown in FIG. 13(c) are defined as concave lenses, not convex lenses, even though there are projecting portions.

The definitions of the convex lenses and the concave lenses of the present invention are not limited to the above definitions. In the case where the light collection layer has convex portions and concave portions at a surface on the side facing the light emitting element and the light extraction efficiency is higher than in the case where the surface is flat, the lenses may be defined as convex lenses or concave lenses based on the relationship between the refractive index of the light collection layer and the refractive index of the light-transmissive layer. More specifically, when the refractive index of the light collection layer (e.g., color filters) is higher than the refractive index of the light-transmissive layer (e.g., filler) in contact with the light collection layer, the light collection layer may be defined as including convex lenses. By contrast, when the refractive index of the light collection layer is lower than the refractive index of the light-transmissive layer, the light collection layer may be defined as including concave lenses.

What is claimed is:

1. A display device, comprising:
   a first substrate;
   light emitting elements provided on the first substrate and located in correspondence with pixels arrayed in a matrix;
   a second substrate;
   a light collection layer provided on the second substrate and including, on the side facing the light emitting elements, at least one convex lens in correspondence with each of the pixels; and
   a light-transmissive layer that is provided between the first substrate and the second substrate so as to be in contact with the lens and has a refractive index lower than that of the light collection layer.

2. The display device according to claim 1, wherein the lens of the light collection layer is formed of a color resist.

3. The display device according to claim 2, further comprising an assisting layer having a light transmittance higher than that of the color resist, the assisting layer being provided on the color resist on the side opposite from the light emitting elements, in an area corresponding to a projecting portion of a surface of the color resist.

4. The display device according to claim 1, further comprising a color resist provided between the light collection layer and the second substrate;
   wherein the lens of the light collection layer is formed of a material having a light transmittance higher than that of the color resist.

5. The display device according to claim 1, wherein the light collection layer includes an area where a plurality of the lenses are located in a houndstooth check pattern.

6. The display device according to claim 1, wherein the light-transmissive layer includes a filler filling a space between the first substrate and the second substrate.

* * * * *